(12) United States Patent  (10) Patent No.: US 9,035,698 B2
Liu et al.  (45) Date of Patent: May 19, 2015

(54) GAIN CALIBRATION OF A HIGH SPEED AMPLIFIER

(71) Applicant: Oracle International Corporation, Redwood City, CA (US)

(72) Inventors: Shao H. Liu, Cupertino, CA (US); Peter H. Richert, Round Rock, TX (US)

(73) Assignee: Oracle International Corporation, Redwood City, CA (US)

( * ) Notice: Subject to any disclaimer, the term of this patent is extended or adjusted under 35 U.S.C. 154(b) by 57 days.

(21) Appl. No.: 14/018,267

(22) Filed: Sep. 4, 2013

(65) Prior Publication Data

US 2015/0061765 A1  Mar. 5, 2015

(51) Int. Cl.
 H03G 3/30 (2006.01)
 H03F 3/45 (2006.01)
(52) U.S. Cl.
 CPC ............ H03G 3/30 (2013.01); H03F 3/45179 (2013.01)
(58) Field of Classification Search
 CPC .................................................... H03G 3/301
 USPC .......................................... 330/86, 254, 282
 See application file for complete search history.

(56) References Cited

U.S. PATENT DOCUMENTS

| 6,011,437 | A | 1/2000 | Sutardja et al. |
| 6,169,619 | B1 * | 1/2001 | Ide ................................ 398/209 |
| 6,753,732 | B1 | 6/2004 | Moreland |
| 6,882,226 | B2 | 4/2005 | Cho et al. |
| 7,102,441 | B2 | 9/2006 | Lee et al. |
| 7,391,260 | B2 | 6/2008 | Kim et al. |
| 7,633,337 | B2 | 12/2009 | Nam et al. |
| 2003/0137352 | A1 | 7/2003 | Youn et al. |
| 2010/0283542 | A1 * | 11/2010 | Shivaram et al. ............. 330/253 |

FOREIGN PATENT DOCUMENTS

EP  2093882  8/2009

OTHER PUBLICATIONS

Nishikawa, K. and Tokumitsu T., An MMIC Low-Distortion Variable-Gain Amplifier Using Active Feedback Microwave Theory and Techniques, Dec. 1995, pp. 2812-2816, IEEE Transactions (vol. 43, Issue: 12) (Abstract only).

(Continued)

*Primary Examiner* — Steven J Mottola

(74) *Attorney, Agent, or Firm* — Marsh Fischmann & Breyfogle LLP; Daniel J. Sherwinter

(57) ABSTRACT

Embodiments include systems and methods for accurately controlling gain of a high-speed variable-gain amplifier (VGA) without adversely impacting bandwidth performance. Embodiments include a VGA with a variable resistor, for which resistance is a function of a control level. A gain calibration system controls the control level by using a gain control feedback subsystem to sample outputs of a duplicate VGA, which includes a duplicate variable resistor. The sampled duplicate outputs are compared to a target gain generated by a reference generator. The control level can be fed back to control the gain of the duplicate VGA until the target gain is reached. The control level can also be fed to the actual VGA to control its gain. By performing gain control on the duplicate VGA without interfering with the output signal path of the actual VGA, the actual VGA's gain can be accurately controlled without impacting its bandwidth.

19 Claims, 6 Drawing Sheets

(56) References Cited

OTHER PUBLICATIONS

Ikeda, H., Most Variable Resistor and its Application to an AGC Amplifier, Feb. 1970, pp. 43-45, Solid-State Circuits, IEEE Journal of (vol. 5, Issue: 1) (Abstract only).

Jun-Ning Gan, Wan-Rong Zhang, Hong-Yun Xie; and Dong-Yun Jin, A PIN Diode SiGe HBT Variable Gain Amplifier for WCDMA Applications, Feb. 2009, pp. 596-596, Communication Software and Networks, 2009. ICCSN '09. International Conference. (Abstract only).

* cited by examiner

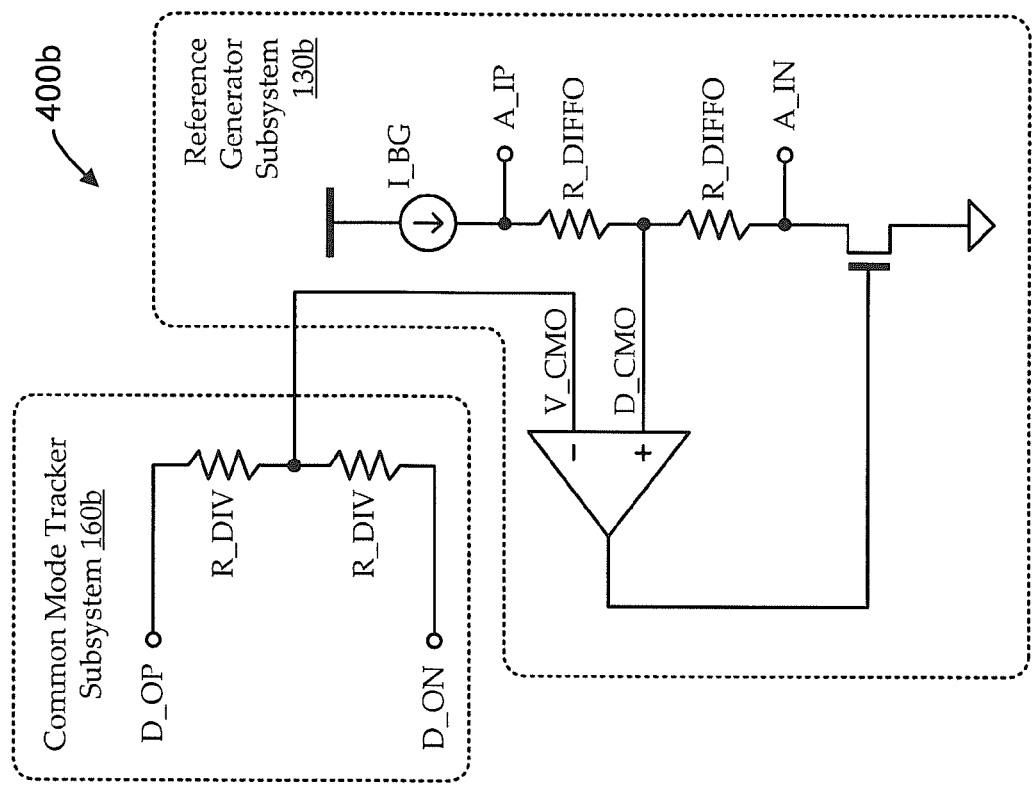
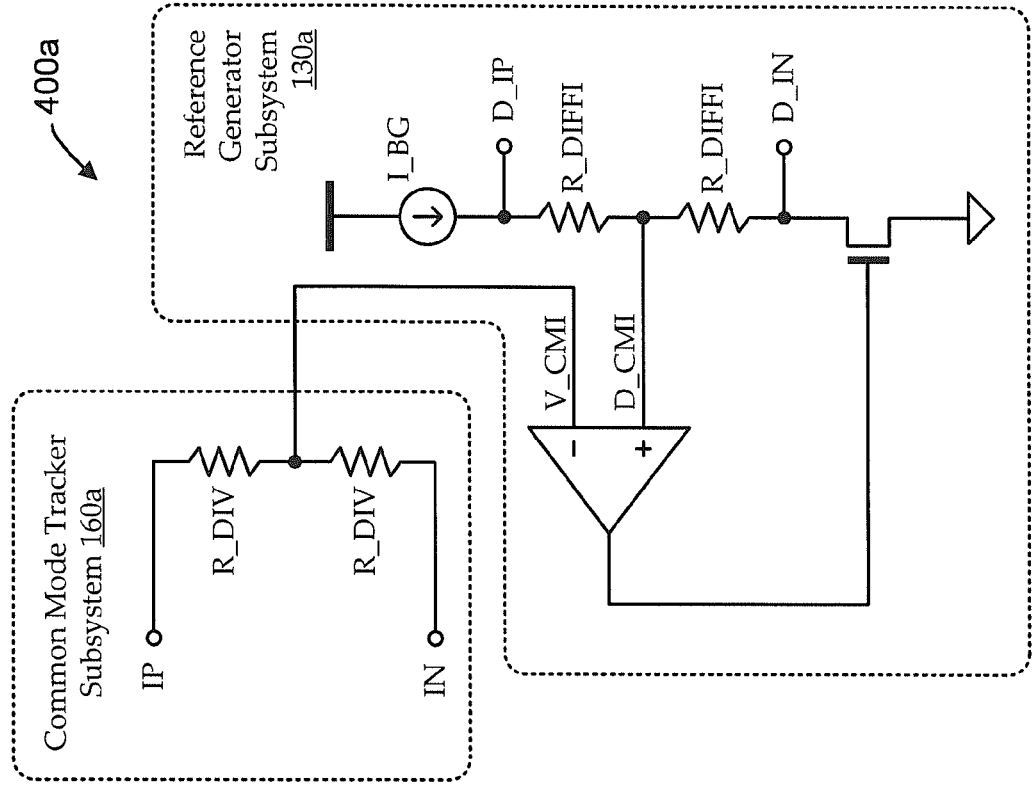
FIG. 4A
FIG. 4B

GAIN CALIBRATION OF A HIGH SPEED AMPLIFIER

FIELD

Embodiments relate generally to electronic circuits, and, more particularly, to gain calibration in context of high speed amplifier circuits.

BACKGROUND

In many electronics applications, it is desirable to provide amplification with variable-gain. These applications often include a variable-gain amplifier (VGA, also called a voltage-controlled amplifier). A variable-gain element, like a voltage controlled resistance, can be used to control and/or vary the gain of an operational amplifier, or the like, as a function of a control level (e.g., a control voltage or current). Accurate gain control can be difficult in many environments. For example, simple differential pairs can have manifest gain variation across process corners and operating conditions. Further, many variable-gain implementations include significant switching networks of either load resistors or a switched parallel series of shunt resistors, which can be large and can, themselves, vary with corner.

For large numbers of applications, relatively slow signal paths can manifest smaller operational variations and/or the operational context can tolerate process variations. Further variable-gain amplifiers are often part of larger feedback loops, so that operational variations can be accounted for by the larger circuit path. However, many newer applications include appreciably higher-speed signal paths and smaller component sizes (e.g., transistor sizes on chips, etc.). In such contexts, typical VGA process variations and resulting operational variations can often be too large, and it can be difficult or impossible to meet all specifications for both gain and bandwidth. For example, using fast sampling techniques to accurately control gain in high-speed applications can add too much output loading, which can appreciably reduce bandwidth.

BRIEF SUMMARY

Among other things, systems and methods are described for accurately controlling gain of a high-speed variable-gain amplifier (VGA) without adversely impacting bandwidth performance. Embodiments include a VGA with a variable resistor (e.g., implemented using a metal-oxide-semiconductor field-effect transistor, MOSFET), for which resistance is a function of a control level (e.g., a gate voltage). A gain calibration system controls the control level by using a gain control feedback subsystem to sample outputs of a duplicate VGA, which includes a duplicate variable resistor (i.e., to duplicate the variable resistor of the actual VGA). The sampled duplicate outputs can be compared to a target gain generated by a reference generator subsystem. Feedback control can be used to adjust the gain of the duplicate VGA according to the control signal until it corresponds to the target gain. The control level can also be fed to the actual VGA to control the gain of its variable resistor. By sampling the duplicate VGA, instead of the actual VGA, the gain can be accurately controlled without impacting the output loading and bandwidth of the actual VGA. Some implementations also generate the target gain using a ratio of resistors, a reference (e.g., bandgap) current, and/or common-mode feedback control so that the performance of the gain calibration system is relatively insensitive to process and environmental (e.g., temperature) variations.

According to one set of embodiments, a VGA system is provided. The system includes: an actual VGA subsystem that generates an actual output signal as a function of an actual input signal and an actual gain, the actual gain set by controlling resistance of an actual variable resistor according to a control level; a duplicate VGA subsystem, designed to duplicate operation of the actual VGA, that generates a duplicate output signal as a function of a duplicate input signal and a duplicate gain, the duplicate gain set by controlling resistance of a duplicate variable resistor according to the control level; a reference generator subsystem that generates the duplicate input signal from the received actual input signal; and a gain control feedback subsystem that generates the control level according to a target gain and the duplicate output signal.

According to another set of embodiments, a method is provided for calibrating gain of a VGA. The method includes: receiving an actual input signal from an actual VGA subsystem; generating a target output signal according to the actual input signal and a target gain; generating a duplicate output signal by a duplicate VGA subsystem according to the actual input signal and a control level used to control gain of the duplicate VGA subsystem; generating the control level by a feedback loop according to the target output signal and the duplicate output signal; and outputting the control level to control gain of the actual VGA subsystem.

According to another set of embodiments, an integrated circuit product is provided for gain calibration of a VGA. The integrated circuit product includes: an input terminal configured to receive an actual input signal from an actual VGA circuit; an output terminal configured to output a control level to the actual VGA; a duplicate VGA circuit that operates, when electrically coupled to the actual VGA, to duplicate operation of the actual VGA by generating a duplicate output signal as a function of a duplicate input signal and a duplicate gain, the duplicate gain set by controlling resistance of a duplicate variable resistor according to the control level; a reference generator circuit that operates to generate the duplicate input signal from the received actual input signal; and a gain control feedback circuit operates to generate the control level according to a target gain and the duplicate output signal.

BRIEF DESCRIPTION OF THE DRAWINGS

The present disclosure is described in conjunction with the appended figures:

FIGS. 4A and 4B show two portions of another simplified circuit diagram of an illustrative reference generator circuit implemented with a bandgap reference for generating signals for use by gain calibration systems;

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
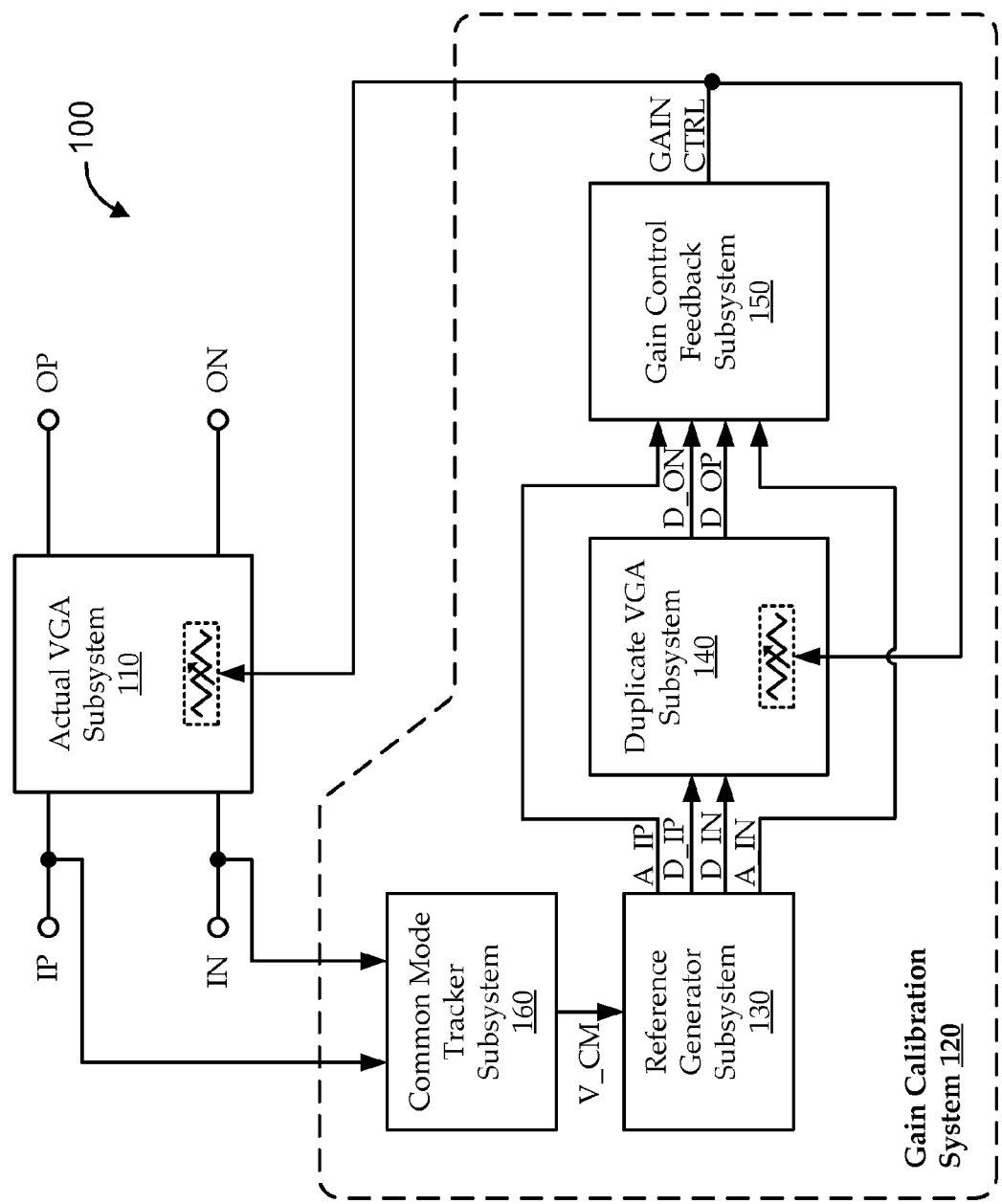
FIG. 1 shows a functional block diagram of a variable gain amplifier (VGA) system, according to various embodiments.

For the sake of context, FIG. 1 shows a functional block diagram of a variable gain amplifier (VGA) system 100, according to various embodiments. The VGA system 100 includes an actual VGA subsystem 110 and a gain calibration system 120 for controlling gain of the actual VGA subsystem 110. The gain calibration system 120 includes a duplicate VGA subsystem 140 that is designed to substantially duplicate operation of the actual VGA subsystem 110. Embodiments of the gain calibration system 120 use a gain control feedback subsystem 150 to generate a gain control signal (illustrated as "GAIN_CTRL") by sampling the output of the duplicate VGA subsystem 140 and feeding back the sampled output to set a desired gain of the duplicate VGA subsystem 140. By sampling and setting the gain of the duplicate VGA subsystem 140 instead of performing those functions directly on the actual VGA subsystem 110, even high-speed sampling of the duplicate VGA subsystem 140 can be performed without appreciably degrading the bandwidth of the actual VGA subsystem 110. For example, certain implementations can support actual VGA subsystems 110 having a bandwidth that is as high as the technology permits by functioning with minimal perturbation of the high-speed path of the actual VGA subsystems 110.

Some embodiments of the gain calibration system 120 further include functionality for setting reference levels (e.g., duplicate inputs, target gain level, etc.) in a manner that is relatively insensitive to variations in environmental conditions (e.g., temperature, etc.) and/or process conditions (e.g., process corners, etc.). As illustrated, some embodiments include a reference generator subsystem 130. As described below, some implementations of the reference generator subsystem 130 generate reference levels according to a network of fixed and/or variable resistors (e.g., discrete resistors, transistors configured as resistors, etc.). Other implementations of the reference generator subsystem 130 generate reference levels according to a bandgap reference level that provides a stable bandgap reference current to a network of resistors. The reference levels can be generated by the reference generator subsystem 130 according to a common mode level (illustrated as "V_CM") generated by a common mode tracker subsystem 160.

As illustrated, signals of the actual VGA subsystem 110 include no prefix. For example, its input signal can include "IP" (i.e., a positive input level) and "IN" (i.e., a negative input level), and its output signal can include "OP" (i.e., a positive output level) and "ON" (i.e., a negative output level). Signals of the duplicate VGA subsystem 140 include a prefix of "D_". For example, its input signal can include "D_IP" (i.e., a positive input level) and "D_IN" (i.e., a negative input level), and its output signal can include "D_OP" (i.e., a positive output level) and "D_ON" (i.e., a negative output level). One implementation of the reference generator subsystem 130 generates D_IP from R_IP and generates D_IN from R_IN (e.g., the signals are coupled together or are functions of one another). Another implementation of the reference generator subsystem 130 generates V_CM from R_IP and R_IN, and generates D_IP and D_IN from V_CM. The reference generator also generates a target gain level, from which target output levels for the duplicate VGA subsystem 140 can be generated. Target output levels include a prefix of "A_", such as the illustrated "A_OP" (i.e., a positive target output level) and "A_ON" (i.e., a negative target output level). Embodiments of the gain control feedback subsystem 150 generate GAIN_CTRL as a function of "D_OP," "D_ON," "A_OP," and "A_ON."

Figure 2:
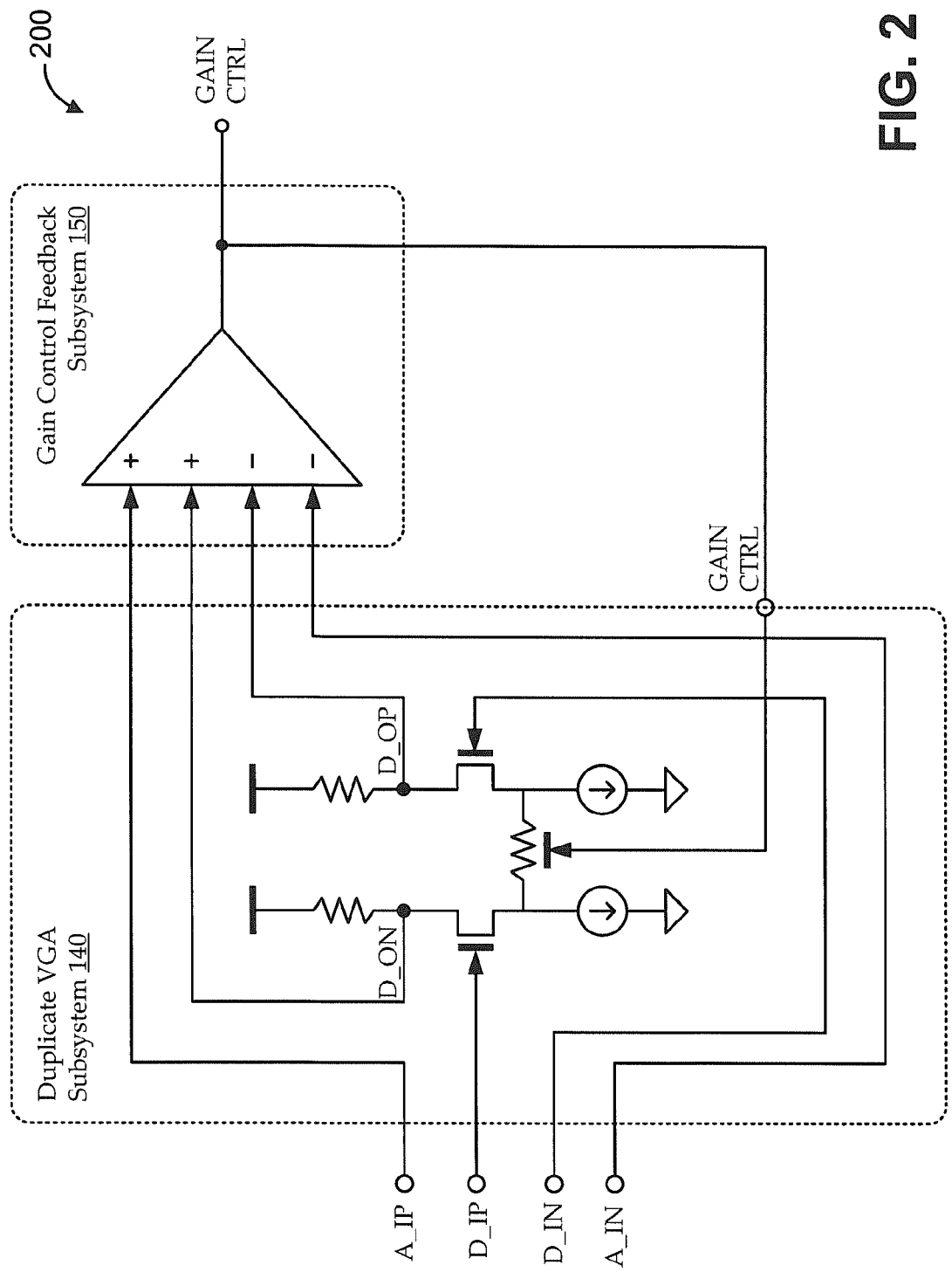
FIG. 2 shows a simplified circuit diagram of an illustrative partial gain calibration system, according to various embodiments.

FIG. 2 shows a simplified circuit diagram of an illustrative partial gain calibration system 200, according to various embodiments. The partial gain calibration system 200 includes implementations of a duplicate VGA subsystem 140 and a gain control feedback subsystem 150. The duplicate VGA subsystem 140 is illustrated as a differential pair amplifier having two sides, each with a current source, a transistor, and a load resistor. The legs of the two sides are effectively shorted together using a variable resistor. The gain of the duplicate VGA subsystem 140 is controlled by the GAIN_CTRL signal level. For example, the variable resistor has a voltage-controlled resistance, and the GAIN_CTRL signal provides the voltage control. In some implementations, the variable resistor is implemented as a metal-oxide-semiconductor field-effect transistor (MOSFET), and the GAIN_CTRL signal controls the gate voltage of the MOSFET.

As described above, the duplicate VGA subsystem 140 can generate an output signal including D_OP and D_ON according to D_IP, D_IN, and GAIN_CTRL. The gain control feedback subsystem 150 can be implemented as a four-input operational amplifier or in any other suitable manner. The inputs to the gain control feedback subsystem 150 can be the outputs of the duplicate VGA subsystem 140 (D_OP and D_ON) and target output levels of the duplicate VGA subsystem 140 generated according to a target gain level ("A") as described above (A_OP and A_ON). For example, the gain control feedback subsystem 150 can generate GAIN_CTRL according to the equation $G*[(A\_OP-A\_ON)-(D\_OP-D\_ON)]$, where "G" is the gain of the operational amplifier. By feeding the generated GAIN_CTRL back to control the gain of the duplicate VGA subsystem 140, the gain of the duplicate VGA subsystem 140 can adjust until its outputs are substantially equal to the target output levels (e.g., driving GAIN_CTRL to zero). This can effectively force the difference between the outputs of the duplicate VGA subsystem 140 (i.e., D_OP−D_ON) to equal the target gain times the difference between the inputs to the duplicate VGA subsystem 140 (i.e., $A*(D\_IP-D\_IN)$). The GAIN_CTRL signal (or a signal that is a function thereof) can be used to control gain of an actual VGA subsystem 110, for example as illustrated in FIG. 1. Performing sampling and feedback on the signal path of the duplicate VGA subsystem 140 limits the impact of the gain control on the loading and bandwidth of the actual VGA subsystem 110.

Figure 3:
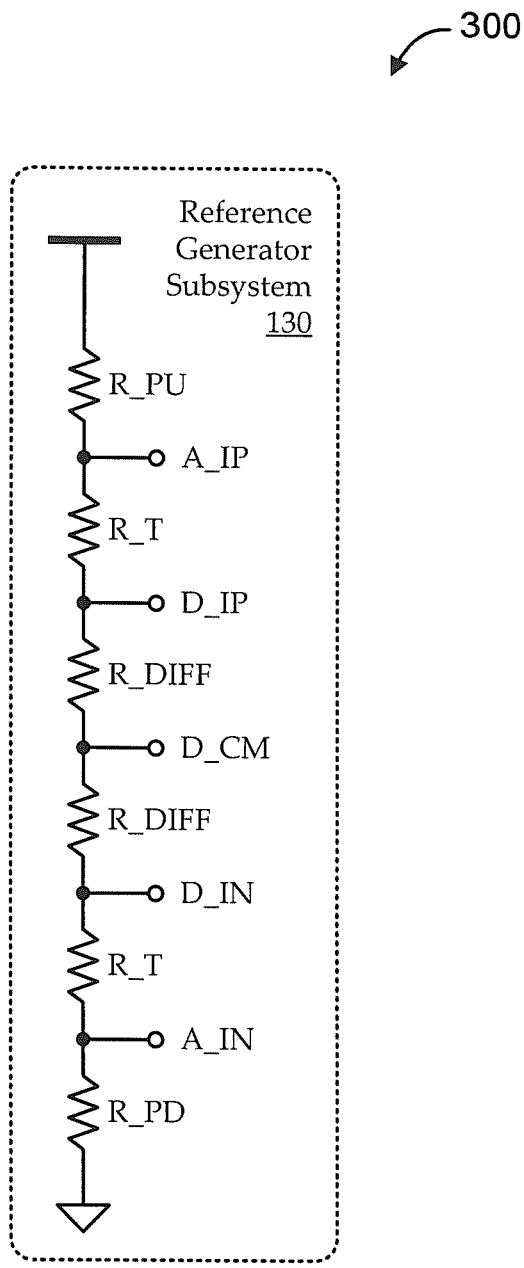
FIG. 3 shows a simplified circuit diagram of an illustrative reference generator circuit implemented as a resistor ladder for generating signals for use by gain calibration systems.

As further described above, embodiments of gain calibration systems can generate various signals in a manner that is relatively insensitive to environmental and/or process variations. FIG. 3 shows a simplified circuit diagram of an illustrative reference generator circuit 300 implemented as a resistor ladder for generating signals for use by gain calibration systems 120. The reference generator circuit 300 can be an implementation of the reference generator subsystem 130 of FIG. 1. As illustrated, the reference generator subsystem 130 can be implemented as a resistor ladder having six resistors (e.g., discrete resistors or other resistive elements), including a pull-up resistor ("R_PU") and a pull-down resistor ("R_PD"), a resistor divider network for generating reference positive and negative input levels to the duplicate VGA subsystem 140 (illustrated as "R_DIFF"), and resistors for generating target output levels according to the reference input levels and a target gain (illustrated as "R_T"). In some implementations, some or all of the resistors can be adjustable. For example, the R_T resistors can be adjusted to provide different target gains. Adjustable and non-adjustable resistors can be implemented as transistors, networks of switched resistors, or in any other suitable manner.

Embodiments of the reference generator circuit 300 can also generate a duplicate common mode voltage signal ("D_CM"), where desired. The duplicate common mode signal ("D_CM") is effectively stepped up and down by adjacent R_DIV resistors (or by a single resistor, multiple resistors, resistors of different values, or any suitable configuration) to generate the duplicate differential levels "D_IP" and "D_IN" for the duplicate VGA subsystem 140. The duplicate differential levels are stepped up and down again by adjacent R_T resistors to generate the target output levels "A_OP" and "A_ON." As described above, the D_IP and D_IN signals can be used by the duplicate VGA subsystem 140 to generate D_OP and D_ON levels according to the gain of the duplicate VGA subsystem 140. The D_OP, D_ON, A_OP, and A_ON signals can then be used by the gain control feedback subsystem 150 to generate a gain control signal (GAIN_CTRL), which can be fed back to the duplicate VGA subsystem 140 and fed forward to the actual VGA subsystem 110.

FIGS. 4A and 4B show two portions of another simplified circuit diagram of an illustrative reference generator circuit 400 implemented with a bandgap reference for generating signals for use by gain calibration systems 120. Each portion of the reference generator circuit 400 includes an implementation of the reference generator subsystem 130 and the common mode tracker subsystem 160 of FIG. 1. Turning first to FIG. 4A, the common mode tracker subsystem 160a is illustrated as a simple resistor divider with two resistors (illustrated as "R_DIV") in series between differential input levels of the actual VGA subsystem 110 ("IP" and "IN"), so that a voltage level at the node between the two resistors reflects the common mode of the input signal to the actual VGA subsystem 110 ("V_CMI").

It is worth noting that implementations of the gain calibration system operate largely in the direct current (DC) domain, which can minimize perturbation by the gain calibration functionality on the alternating current (AC), potentially high speed, signal path of the actual VGA circuit. As described above, this can permit the actual VGA to operate with high bandwidth and other features, while still providing highly accurate gain calibration. Operation of the gain calibration system substantially in the DC domain can be accomplished using one or more techniques. According to one such technique, the values of the R_DIV resistors can be selected to be much larger than driver impedances of the D_OP and D_ON signals and/or the values of the R_DIV resistors can be selected to be much larger than the load resistors used in the VGA subsystems. According to another such technique, the R_DIV resistors can be physically located near the IP and IN signal paths.

The reference generator subsystem 130a is illustrated as a resistor divider driven by a bandgap current source. The bandgap current source generates a bandgap current (illustrated as "I_BG") and can be implemented in any suitable manner. A resistor divider and a transistor are in series with the bandgap current source, so that the bandgap current manifests a voltage across the two resistors of the resistor divider (illustrated as "R_DIFFI"). A node above the resistor divider can reflect a duplicate positive input level (D_IP), a node below the resistor divider can reflect a duplicate negative input level (D_IN), and a node between the resistors of the resistor divider can reflect a common mode of the duplicate input levels (illustrated as "D_CMI").

The actual and duplicate input common mode levels (V_CMI and D_CMI) can be used as differential inputs to an operational amplifier, and the output of the operational amplifier can be used to control the gate of the transistor in the bandgap current path. This can cause the difference between the actual and duplicate input common mode levels to adjust a resistor value (e.g., via the current through the transistor), which can effectively adjust the voltage level at the bottom of the resistor divider and change the duplicate input common mode level. In this way, the duplicate input common mode can effectively track the actual input common mode in a manner that is precise and substantially insensitive to environmental and process variations (e.g., temperature).

Turning to FIG. 4B, the common mode tracker subsystem 160b and the reference generator subsystem 130b can be substantially identical to those in FIG. 4A, but with different signals. In particular, the common mode tracker subsystem 160b takes differential duplicate output levels ("D_OP" and "D_ON") as its inputs and generates their corresponding common mode ("V_CMO"). According to some embodiments, the output levels of the duplicate VGA subsystem 140 have the same common mode as that of the output levels of the actual VGA subsystem 110, so that the actual differential output levels ("OP" and "ON") can be used as inputs to the common mode tracker subsystem 160b. However, coupling the common mode tracker subsystem 160b with the actual output levels can cause output loading of the actual VGA subsystem 110, which can effectively add capacitance to the signal path, slow down performance, reduce bandwidth, etc. The reference generator subsystem 130b can operate in a substantially identical manner to that of FIG. 4A. However, the resistor values (illustrated as "R_DIFFO") can be different from the R_DIFFI values of FIG. 4A to generate the target output levels ("A_OP" and "A_ON") according to a target gain. For example, in this way, the ratio of R_DIFFO to R_DIFFI can be used to set the target gain, and the operational amplifier can cause the common mode of the target output levels to follow that of the actual output levels.

Figure 5:
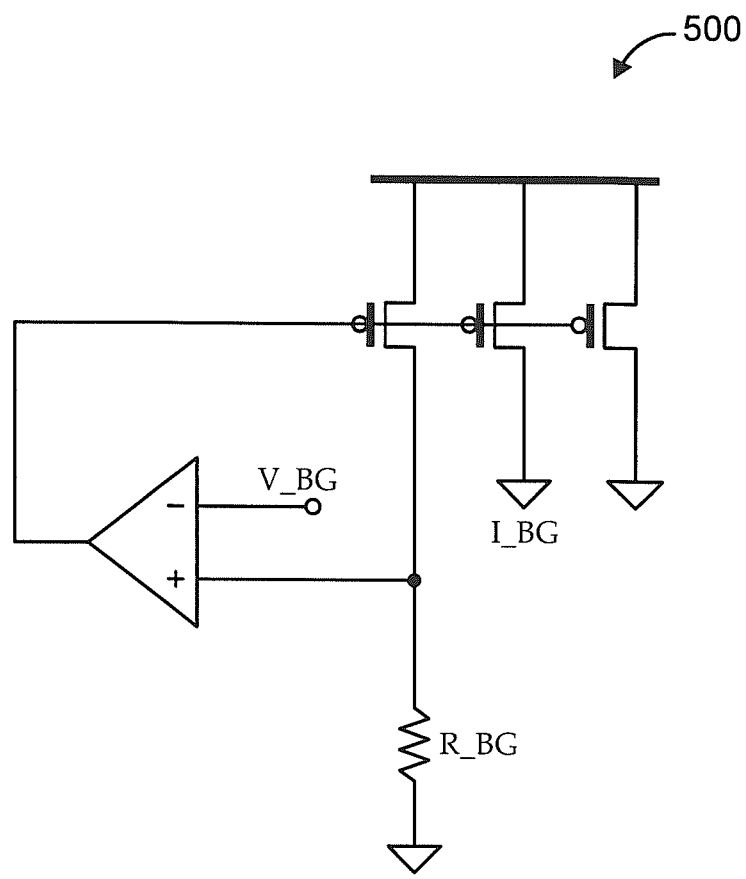
FIG. 5 shows a simplified circuit diagram of an illustrative bandgap current generator, according to various embodiments.

In some embodiments, the bandgap current generator shown in FIGS. 4A and 4B can be designed to further limit the sensitivity of the circuits to environmental and process variations. For example, FIG. 5 shows a simplified circuit diagram of an illustrative bandgap current generator 500, according to various embodiments. As illustrated, the bandgap current generator 500 can include an operational amplifier that has, as its inputs, a bandgap voltage ("V_BG") and a voltage that is a function of bandgap resistor ("R_BG") and a bandgap current ("I_BG"). The output of the operational amplifier is coupled with the gates of one or more transistors configured to generate the bandgap current as a function of the gate voltage (i.e., as feedback from the operational amplifier). It is noted that the bandgap voltage, the R_BG value, and/or other aspects of the bandgap current generator 500 may not be highly accurate (e.g., may be highly process dependent) in some implementations. Even in those implementations, however, the ratio between the R_BG and R_DIFF values (i.e., and R_DIFFI or R_DIFFO) can be kept highly accurate. As illustrated in FIGS. 4A and 4B, the bandgap current generator is coupled with the circuit in a manner such that the duplicate positive input level (D_IP) and the duplicate negative input level (D_IN) are a function of the ratio between the R_BG and R_DIFF values. For example, the relationship can be calculated as follows:

$$D_{IP} - D_{IN} = 2 * \frac{V_{BG}}{R_{BG}} * R_{DIFF}$$

Figure 6:
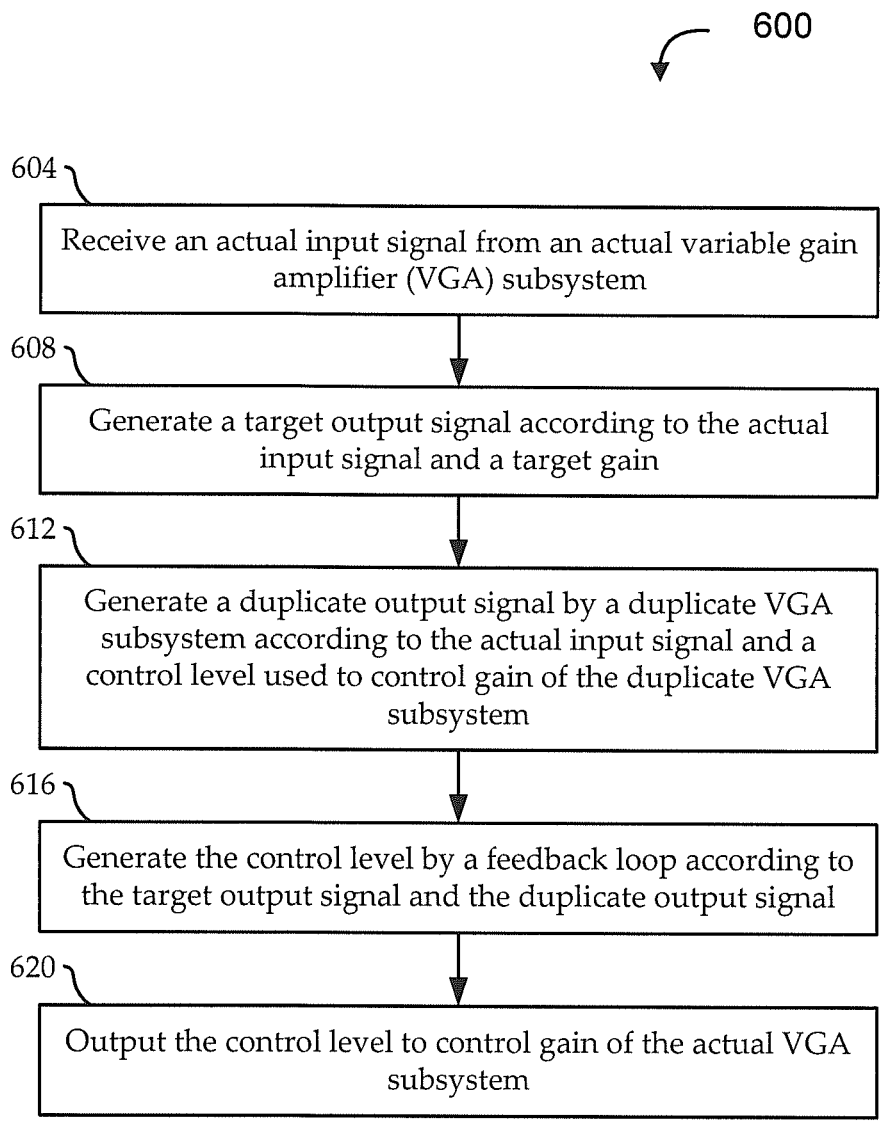
FIG. 6 shows a flow diagram of an illustrative method for calibrating gain of a VGA, according to various embodiments.

FIG. 6 shows a flow diagram of an illustrative method 600 for calibrating gain of a variable-gain amplifier (VGA), according to various embodiments. Embodiments of the method 600 use a duplicate VGA subsystem as part of a gain calibration system for calibrating gain of an actual VGA subsystem without loading the output of the actual VGA subsystem. Implementations begin at stage 604 by receiving an actual input signal from the actual VGA subsystem. At stage 608, a target output signal is generated according to the actual input signal and a target gain. In some implementations, duplicate input levels are also generated according to the actual input signal. At stage 612, a duplicate output signal is generated by a duplicate VGA subsystem according to the actual input signal and a control level used to control gain of the duplicate VGA subsystem. In some implementations, the duplicate VGA subsystem generates the duplicate output signal according to the duplicate input levels generated from the actual input levels. As described above, various implementations use resistor networks and/or various types of feedback to force the target output signal to reflect the target gain as compared to the duplicate input levels. For example, some implementations generate the duplicate input levels and/or the target levels using a reference (e.g., bandgap) current in a manner that is substantially insensitive to process and environmental variations.

At stage 616, the control level is generated by a feedback loop according to the target output signal and the duplicate output signal. The generated control level can be fed back to the duplicate VGA subsystem to effectively force the duplicate output levels of the duplicate output signal to correspond to the target output levels. In this way, the gain of the duplicate VGA subsystem can effectively correspond to the target gain. At stage 620, the control level can be output to control gain of the actual VGA subsystem. For example, the control level can be used to set a variable resistor of the actual VGA subsystem. As described above, the gain control is in the input signal path (i.e., coupled with the variable resistor and, in some implementations, with the input signal of the actual VGA subsystem), such that it does not load the output signal path of the actual VGA subsystem. The gain can thus be accurately controlled without appreciably impacting the bandwidth of the actual VGA subsystem.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA) or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm, or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A variable-gain amplifier (VGA) system comprising:
an actual VGA subsystem that generates an actual output signal as a function of an actual input signal and an actual gain, the actual gain set by controlling resistance of an actual variable resistor according to a control level;
a duplicate VGA subsystem, designed to duplicate operation of the actual VGA, that generates a duplicate output signal as a function of a duplicate input signal and a duplicate gain, the duplicate gain set by controlling resistance of a duplicate variable resistor according to the control level;
a reference generator subsystem that generates the duplicate input signal from the received actual input signal; and
a gain control feedback subsystem that generates the control level according to a target gain and the duplicate output signal.

2. The variable-gain amplifier system of claim 1, wherein the control level generated by the gain control feedback subsystem is coupled with the actual variable resistor of the actual VGA subsystem.

3. The variable-gain amplifier system of claim 1, wherein:
the reference generator subsystem further generates a target output signal according to the duplicate input signal and the target gain; and
the gain control feedback subsystem generates the control level according to the target output signal and the duplicate output signal.

4. The variable-gain amplifier system of claim 1, wherein the reference generator subsystem comprises:
a bandgap current generator that generates a bandgap current; and
a plurality of resistors configured to generate an output level as a function of a ratio between the plurality of resistors and the bandgap current,
wherein the target gain is a function of the output level.

5. The variable-gain amplifier system of claim 1, wherein:
the reference generator subsystem generates the duplicate input signal to include a first duplicate input level and a second duplicate input level;
the reference generator subsystem generates a first target level as a function of the first duplicate input level and the target gain, and a second target level as a function of the second duplicate input level and the target gain;
the duplicate VGA subsystem generates the duplicate output signal to include a first duplicate output level and a second duplicate output level as a function of the first and second duplicate input levels; and
the gain control feedback subsystem generates the control level as a function of the first and second duplicate output levels and the first and second target levels.

6. The variable-gain amplifier system of claim 5, wherein the actual input signal includes a first actual input level and a second actual input level, and further comprising:
a common mode tracker subsystem that generates a common mode level as a function of the first and second actual input levels,
wherein the reference generator subsystem generates the first and second duplicate input levels according to the common mode level.

7. A method for calibrating gain of a variable-gain amplifier (VGA), the method comprising:
receiving an actual input signal from an actual VGA subsystem;
generating first and second duplicate input levels according to the received actual input signal;
generating a target output signal according to the actual input signal and a target gain by generating first and second target levels as a function of the first and second duplicate input levels and the target gain;
generating a duplicate output signal by a duplicate VGA subsystem according to the actual input signal and a control level used to control gain of the duplicate VGA subsystem, such that the duplicate output signal includes a first duplicate output level and a second duplicate output level generated as a function of the first and second duplicate input levels, and the control level is generated as a function of the first an second duplicate output levels and the first and second target levels;
generating the control level by a feedback loop according to the target output signal and the duplicate output signal; and
outputting the control level to control gain of the actual VGA subsystem.

8. The method of claim 7, further comprising controlling the gain of the actual VGA subsystem according to the control level.

9. The method of claim 7, further comprising:
generating a reference current; and
generating an output level as a function of a ratio between a plurality of resistors and the reference current,
wherein the target gain is a function of the output level.

10. The method of claim 7, wherein the actual input signal includes a first actual input level and a second actual input level, and further comprising:
generating a common mode level as a function of the first and second actual input levels,
wherein the reference generator subsystem generates the first and second duplicate input levels according to the common mode level.

11. An integrated circuit product for gain calibration of a variable-gain amplifier (VGA), the integrated circuit product comprising:
an input terminal configured to receive an actual input signal from an actual VGA circuit;
an output terminal configured to output a control level to the actual VGA;
a duplicate VGA circuit that operates, when electrically coupled to the actual VGA, to duplicate operation of the actual VGA by generating a duplicate output signal as a function of a duplicate input signal and a duplicate gain, the duplicate gain set by controlling resistance of a duplicate variable resistor according to the control level;
a reference generator circuit that operates to generate the duplicate input signal from the received actual input signal; and
a gain control feedback circuit operates to generate the control level according to a target gain and the duplicate output signal.

12. The integrated circuit product of claim 11, further comprising:
the actual VGA circuit, electrically coupled with the input terminal and the output terminal, that operates to generate an actual output signal as a function of the actual input signal and an actual gain, the actual gain set by controlling resistance of an actual variable resistor according to the control level.

13. The integrated circuit product of claim 11, wherein:
the reference generator circuit further generates a target output signal according to the duplicate input signal and the target gain; and
the gain control feedback circuit generates the control level according to the target output signal and the duplicate output signal.

14. The integrated circuit product of claim 11, wherein the reference generator circuit comprises:
a resistor ladder configured to generate the duplicate input signal and a target output signal as a function of a ratio between resistors of the resistor ladder, such that a ratio between the generated duplicate input signal and target output signal is the target gain.

15. The integrated circuit product of claim 11, wherein:
the reference generator circuit generates the duplicate input signal to include a first duplicate input level and a second duplicate input level;
the reference generator circuit generates a first target level as a function of the first duplicate input level and the target gain, and a second target level as a function of the second duplicate input level and the target gain;
the duplicate VGA circuit generates the duplicate output signal to include a first duplicate output level and a second duplicate output level as a function of the first and second duplicate input levels; and
the feedback control circuit generates the control level as a function of the first and second duplicate output levels and the first and second target levels.

16. The integrated circuit product of claim 15, wherein the actual input signal includes a first actual input level and a second actual input level, and further comprising:
a common mode tracker circuit that generates an input common mode level as a function of the first and second actual input levels and generates an output common mode level as a function of the first and second duplicate output levels,
wherein the reference generator circuit generates the first and second duplicate input levels according to the input common mode level and generates the first and second target levels according to the output common mode level.

17. The integrated circuit product of claim 16, wherein the reference generator circuit comprises:
a first sub-circuit comprising:
a first resistor, a second resistor, and a first voltage-controlled resistor coupled in series to provide the first duplicate input level at a first node on one side of the first and second resistors, the second duplicate input level at a second node on the other side of the first and second resistors, and a duplicate input common mode level at a third node between the first and second resistors; and
an operational amplifier configured to compare the input common mode level with the duplicate input common mode level to generate a signal for controlling the first voltage-controlled resistor, such that the duplicate input common mode level varies with a resistance of the first voltage-controlled resistor; and
a second sub-circuit comprising:
a third resistor, a fourth resistor, and a second voltage-controlled resistor coupled in series to provide the first target output level at a fourth node on one side of the third and fourth resistors, the second target output level at a fifth node on the other side of the third and fourth resistors, and a duplicate output common mode level at a sixth node between the third and fourth resistors; and
an operational amplifier configured to compare the output common mode level with the duplicate output common mode level to generate a signal for controlling the second voltage-controlled resistor, such that the duplicate output common mode level varies with a resistance of the second voltage-controlled resistor.

18. The integrated circuit product of claim 11, wherein the duplicate VGA circuit comprises a differential pair amplifier having its legs shorted by the actual variable resistor.

19. The integrated circuit product of claim 11, wherein the duplicate variable resistor comprises a metal-oxide-semiconductor field-effect transistor.

* * * * *

UNITED STATES PATENT AND TRADEMARK OFFICE
CERTIFICATE OF CORRECTION

PATENT NO. : 9,035,698 B2
APPLICATION NO. : 14/018267
DATED : May 19, 2015
INVENTOR(S) : Liu et al.

Page 1 of 1

It is certified that error appears in the above-identified patent and that said Letters Patent is hereby corrected as shown below:

In the claims,
In column 10, line 18, in Claim 7, delete "an" and insert -- and --, therefor.

Signed and Sealed this
Ninth Day of February, 2016

Michelle K. Lee
*Director of the United States Patent and Trademark Office*